United States Patent
Moradian et al.

(10) Patent No.: US 12,492,487 B2
(45) Date of Patent: Dec. 9, 2025

(54) MOVABLE CENTRAL REFLECTORS OF SEMICONDUCTOR PROCESSING EQUIPMENT, AND RELATED SYSTEMS AND METHODS

(71) Applicant: Applied Materials, Inc., Santa Clara, CA (US)

(72) Inventors: Ala Moradian, Sunnyvale, CA (US); Vishwas Kumar Pandey, Madhya Pradesh (IN); Lori D. Washington, San Jose, CA (US); Saurabh Chopra, Santa Clara, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 363 days.

(21) Appl. No.: 18/223,345

(22) Filed: Jul. 18, 2023

(65) Prior Publication Data

US 2024/0360587 A1    Oct. 31, 2024

(30) Foreign Application Priority Data

Apr. 28, 2023 (IN) .............................. 202341030609

(51) Int. Cl.
    *C30B 25/10*      (2006.01)
    *C23C 16/46*      (2006.01)

(52) U.S. Cl.
    CPC .............. *C30B 25/10* (2013.01); *C23C 16/46* (2013.01)

(58) Field of Classification Search
    CPC ....... C30B 25/10; C30B 25/105; C23C 16/46; C23C 16/52
    See application file for complete search history.

(56) References Cited

U.S. PATENT DOCUMENTS

| 9,845,550 | B2 | 12/2017 | Brillhart et al. |
| 10,161,041 | B2 * | 12/2018 | Lo .......................... C23C 16/458 |
| 11,377,754 | B2 * | 7/2022 | Preti ........................ C30B 25/10 |

(Continued)

FOREIGN PATENT DOCUMENTS

| CN | 113539893 A | 10/2021 | |
| JP | 2005044881 A | * 2/2005 | |
| WO | WO-0131080 A2 | * 5/2001 | ........... C23C 14/083 |

OTHER PUBLICATIONS

International Search Report and Written Opinion for PCT/US2024/012081 dated May 20, 2024.

*Primary Examiner* — Robert M Kunemund
(74) *Attorney, Agent, or Firm* — Patterson + Sheridan, LLP (57) ABSTRACT

The present disclosure relates to a radiation reflector assembly for use with a semiconductor processing chamber and a substrate processing system having the radiation reflector assembly. The radiation reflector assembly includes a shell body that includes an interior cylindrical wall; and a reflector disk that includes a center hole, a bottom reflective surface, and a top surface. The reflector disk is disposed within and spaced from the interior cylindrical wall in a manner that permits fluid to flow therebetween. The radiation reflector assembly includes an actuator coupled to the reflector disk, and the actuator is operable to axially displace the reflector disk relative to the shell body. The radiation reflector assembly includes an elongated tube extending through the center hole of the reflector disk. A method of processing a substrate with the radiation reflector assembly is also described.

20 Claims, 7 Drawing Sheets

(56) References Cited

U.S. PATENT DOCUMENTS

| | | |
|---|---|---|
| 2010/0260589 A1 | 10/2010 | Hwang et al. |
| 2011/0121503 A1* | 5/2011 | Burrows ................ C23C 16/481 |
| | | 269/289 R |
| 2013/0193132 A1 | 8/2013 | Serebryanov et al. |
| 2015/0252476 A1* | 9/2015 | Yang ................. H01L 21/68785 |
| | | 118/725 |
| 2016/0348276 A1 | 12/2016 | Lau et al. |
| 2016/0355947 A1 | 12/2016 | Dobrinsky et al. |
| 2018/0130652 A1 | 5/2018 | Pettinger et al. |
| 2020/0115829 A1* | 4/2020 | Liang ....................... D04B 1/16 |
| 2021/0189593 A1 | 6/2021 | Burrows et al. |

\* cited by examiner

MOVABLE CENTRAL REFLECTORS OF SEMICONDUCTOR PROCESSING EQUIPMENT, AND RELATED SYSTEMS AND METHODS

CROSS-REFERENCE TO RELATED APPLICATION

This application claims priority to India provisional patent application serial number 202341030609, filed Apr. 28, 2023, which is herein incorporated by reference in its entirety.

BACKGROUND

Field

The present disclosure relates to a radiation reflector assembly for use with a semiconductor processing chamber, and related apparatus, systems, and methods.

Description of the Related Art

In the fabrication of integrated circuits, deposition processes are used to deposit films of various materials upon semiconductor substrates. Epitaxy is a deposition process that grows a thin, ultra-pure layer, usually of silicon or germanium, on a surface of a substrate. Forming an epitaxial layer on a substrate with uniform thickness across the surface of the substrate can involve precise temperature control. Generally speaking, the process temperature of a deposition process is largely determined by heat sources. Other methods and parts, such as reflectors, can be used to direct the heat to various locations of the semiconductor substrate to fine tune the heat distribution and temperature profile of the semiconductor substrate. However, the currently available reflectors used in deposition chambers can be limited with respect to locations and/or reflecting directions. Reflectors can fail, for example, to adjust energy directing abilities when processing parameters of a deposition chamber are adjusted.

Thus, there is a need for an improved reflector component for a process chamber that facilitates adjustability of directing energy toward the substrate in a modular and flexible manner.

SUMMARY

The present disclosure relates to a radiation reflector assembly for use with a semiconductor processing chamber, and related apparatus, systems, and methods. A method of processing a substrate with the radiation reflector assembly is also described.

In one or more embodiments, a radiation reflector assembly for use with a semiconductor processing chamber includes a shell body that includes an interior cylindrical wall; and a reflector disk that includes a center hole, a bottom reflective surface, and a top surface. The radiation reflector assembly includes a reflector disk disposed within and spaced from the interior cylindrical wall in a manner that permits fluid to flow therebetween; and an actuator coupled to the reflector disk. The actuator is operable to axially displace the reflector disk relative to the shell body. The radiation reflector assembly includes an elongated tube extending through the center hole of the reflector disk.

In one or more embodiments, a substrate processing system for processing a substrate includes a chamber body comprising an internal volume; and a substrate support disposed in the internal volume. The substrate processing system includes a transparent window supported at least partially by the chamber body; and a shell body disposed above the transparent window and including an interior cylindrical wall. The substrate processing system includes a plurality of heat sources disposed above the transparent window and circumscribing the shell body. The substrate processing system includes a reflector disk separated from the plurality of heating lamps by the shell body; and an actuator coupled to the reflector disk. The actuator is operable to axially displace the reflector disk within the interior cylindrical wall of the shell body.

In one or more embodiments, a method of processing a substrate includes positioning a cylindrical wall to separate a source reflector and a heat source from a movable radiation reflector. The method includes directing, using the source reflector, radiant energy from the heat source to a substrate disposed within a processing chamber. The method includes directing, using the movable radiation reflector that includes a reflective disk, radiant energy propagating out of the processing chamber back into the processing chamber while processing the substrate. The method includes adjusting one or more process parameters for the substrate by moving the movable radiation reflector.

BRIEF DESCRIPTION OF THE DRAWINGS

So that the manner in which the above recited features of the disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Embodiments described herein relate to a movable radiation reflector for use with a semiconductor processing chamber, and related apparatus, systems, and methods. The movable radiation reflector is configured to reflect radiant energy (which is reflecting out of the semiconductor processing chamber) back to the semiconductor processing chamber. The radiant energy may include radiation in the infrared spectrum, the ultraviolet spectrum, and/or another spectrum (such as one or more spectrums that may be used for a semiconductor processing chamber). The movable radiation reflector as described in the present application can be axially displaced along a center axis such that the movable radiation reflector can be used to adjust or fine-tune the radiant energy received by the substrate during processing (e.g., epitaxial deposition), which will impact the temperature profile of the substrate and/or the deposition uniformity (e.g., center-to-edge uniformity) of the substrate. The movable radiation reflector can also generate additional channels for a cooling medium, such as air or liquid, which may be beneficial to lower the temperature of components adjacent to heat source(s). The movable radiation reflector provides one or more adjustability options to control the temperature profile of a semiconductor substrate.

It is noted that the movable radiation reflector can be used in addition to source reflector(s). Heat sources (e.g., lamps) of a processing chamber can have associated reflectors that are disposed adjacent to the heat sources and are configured to direct radiant energy toward the substrate. A cylindrical wall can be used to shield the heat sources and the associated reflectors from other parts.

In this disclosure, the terms "top", "bottom", "side", "above", "below", "up", "down", "upward", "downward", "horizontal", "vertical", and the like do not refer to absolute directions. Instead, these terms refer to directions relative to a non-specific plane of reference. This non-specific plane of reference may be vertical, horizontal, or another angular orientation.

The disclosure contemplates that terms such as "couples," "couplable," "coupling," "couple," and "coupled" may include but are not limited to welding, fusing, melting together, interference fitting, and/or fastening such as by using bolts, nuts, threaded connections, pins, and/or screws. The disclosure contemplates that terms such as "couples," "couplable," "coupling," "couple," and "coupled" may include but are not limited to integrally forming. The disclosure contemplates that terms such as "couples," "couplable," "coupling," "couple," and "coupled" may include but are not limited to direct coupling and/or indirect coupling, such as indirect coupling through components such as links, blocks, and/or frames.

Figure 1:
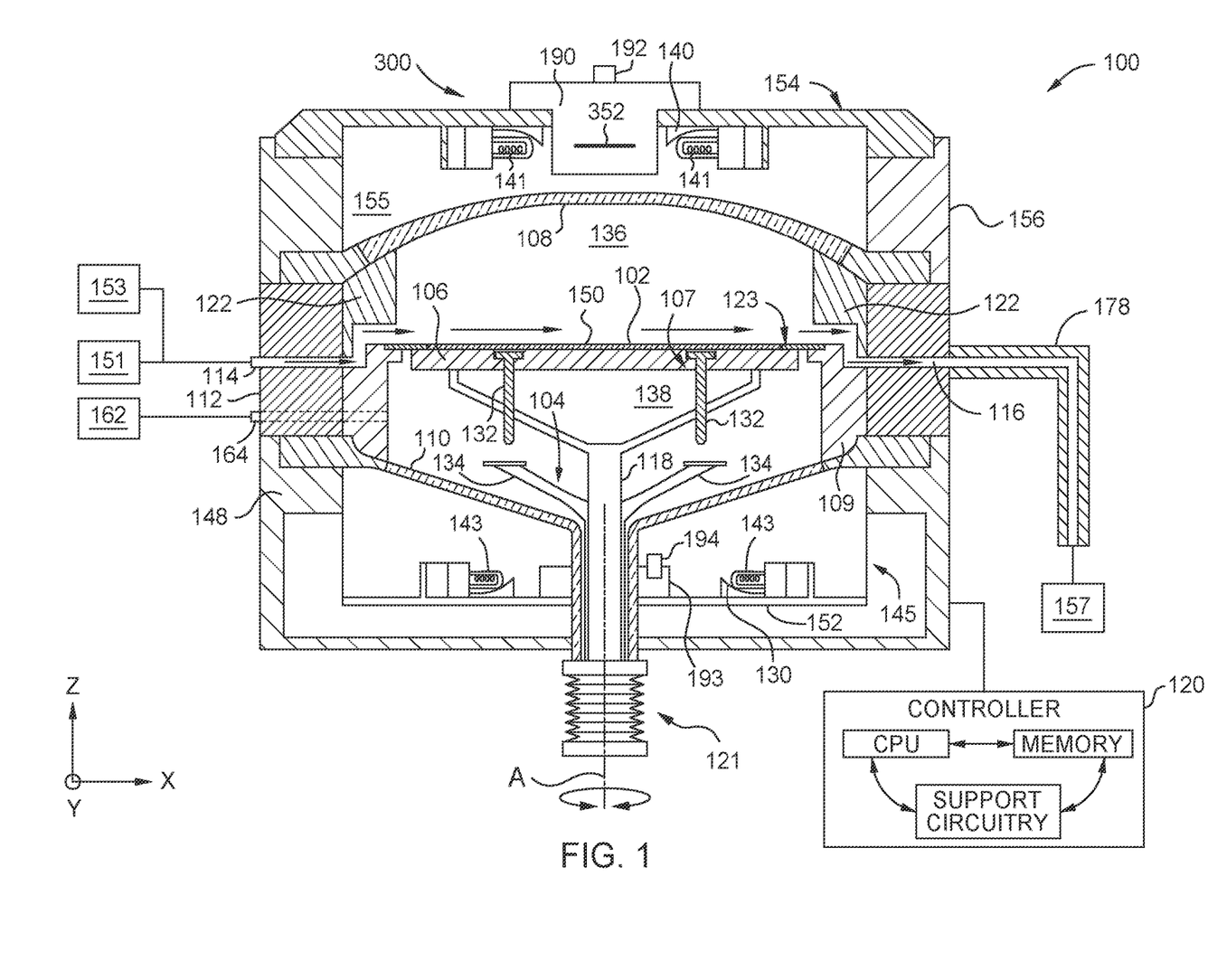
FIG. 1 illustrates a partial schematic side cross-sectional view of a processing chamber, according to one or more embodiments.

FIG. 1 is a partial schematic side cross-sectional view of a processing chamber 100, according to one or more embodiments. The processing chamber 100 is a deposition chamber, such as an epitaxial deposition chamber. The processing chamber 100 is utilized to grow an epitaxial film on a substrate 102. The processing chamber 100 creates a cross-flow of precursors across a top surface 150 of the substrate 102. In one or more embodiments, the processing chamber 100 is used for rapid thermal processing. The process chamber 100 can operate under vacuum, such as, at reduced pressures or near atmospheric pressure. Other pressures are contemplated.

The processing chamber 100 includes an upper body 156, a lower body 148 disposed below the upper body 156, and a flow module 112 disposed between the upper body 156 and the lower body 148. The upper body 156, the flow module 112, and the lower body 148 form at least part of a chamber body. Disposed within the chamber body is a substrate support 106, an upper window 108 (such as an upper dome), a lower window 110 (such as a lower dome), a plurality of upper heat sources 141, and a plurality of lower heat sources 143. As shown, a controller 120 is in communication with the processing chamber 100 and is used to control processes and methods, such as the operations of the methods described herein.

In one or more embodiments, the heat sources (such as the heat sources 141, 43) discussed herein include radiant heat sources such as lamps, for example halogen lamps. The present disclosure contemplates that other heat sources may be used (in addition to or in place of the lamps) for the various heat sources described herein. For example, resistive heaters, light emitting diodes (LEDs), and/or lasers may be used for the various heat sources described herein. The heat sources generate radiant heat which are radiated toward the substrate support 106 disposed between the upper window 108 and the lower window 110 and having a support face 123 that supports the substrate 102.

The plurality of upper heat sources 141 are disposed between the upper window 108 and a lid 154. The plurality of upper heat sources 141 form a portion of the upper heat source module 155. Upper heat sources 141 provide heat to the substrate 102 and/or the substrate support 106. As described above, upper heat sources 141 can be, for example, tungsten filament heat sources or higher power LEDs. The plurality of upper heat sources 141 can direct radiation, such as infrared radiation, through the upper window 108 to heat the substrate 102 and/or the substrate support 106. The lid 154 may include a plurality of sensors disposed therein or thereon for measuring temperature(s) within the processing chamber 100.

The plurality of lower heat sources 143 are disposed between the lower window 110 and a floor 152. The plurality of lower heat sources 143 form a portion of a lower heat source module 145. As discussed above, lower heat sources 143 can be, for example, tungsten filament heat sources or higher power LEDs. The plurality of lower heat sources 143 can direct radiation, such as infrared radiation, through the lower window 110 to heat the substrate 102 and/or the substrate support 106.

In one or more embodiments, the upper heat sources 141 above the substrate support 106 are installed adjacent to a reflector assembly 300. The reflector assembly 300 includes an upper shell assembly 190, an upper source reflector 140 disposed at peripheral areas of the upper shell assembly 190, a movable radiation reflector 352 (such as a movable heat reflector) disposed in a central area of the upper shell assembly 190, and a thermal sensor 192 (e.g., a temperature sensor). The sensor 192 is positioned and operable to sense a temperature of an object (such as the substrate 102) by collecting energy (e.g., light) through a sensor tube 356. In one or more embodiments, the upper source reflector 140 is disposed at or adjacent to the perimeter of the upper shell assembly 190 and above the upper heat sources 141. The upper source reflector 140, the upper shell assembly 190, and the movable radiation reflector 352 can include a reflective material, such as a reflective alloy material (e.g., a reflective aluminum alloy), gold, and/or graphite coated with a reflective metal (such as aluminum or gold). In one or more embodiments, the movable radiation reflector 352 is coated with a thin layer of gold. An upper temperature sensor 192, such as a pyrometer, can be installed in or adjacent to the upper shell assembly 190 to detect a temperature of the substrate 102 during processing.

A movable radiation reflector 352 is configured to face a central area of the substrate support 106 and directs radiant energy impinging on the movable radiation reflector 352 toward the substrate support 106 and the substrate 102. The movable radiation reflector 352 is capable of being axially displaced along a center axis of the reflector assembly 300, thus adjusting the amount and direction of heats to be directed toward the substrate 102. The displacement of the movable radiation reflector 352 also generates (e.g., forms and/or adjusts) channels for a cooling medium, such as air or a cooling liquid, to flow through the reflector assembly 300, such as into and/or out of an internal volume of the upper heat source module 155. As shown in FIG. 1, the movable radiation reflector 352 is capable of moving up and down along the Z axis, which can represent a vertical direction.

Lower heat sources 143 can be installed within or adjacent to a lower lamp reflector 130 and within or adjacent to a lower shell assembly 193. The lower lamp reflector 130 can surround the lower shell assembly 193. A lower temperature sensor 194, such as a pyrometer, can be installed in the lower shell assembly 193 to detect a temperature of the substrate support 106 and/or the back side of the substrate 102.

The upper window 108 and the lower window 110 are formed of an energy transmissive material, such as quartz, and may be transparent to allow heat (e.g., radiant energy, such as infrared light) to pass respectively from the upper heat sources 141 and lower heat sources 143 to the substrate 102 and/or the substrate support 106. A process volume 136 and a purge volume 138 are formed between the upper window 108 and the lower window 110. The process volume 136 and the purge volume 138 are part of an internal volume defined at least partially by the upper window 108, the lower window 110, an upper liner 122, and one or more lower liners 109.

The internal volume has the substrate support 106 disposed therein. The substrate support 106 includes a support face 123 on which the substrate 102 is disposed. The substrate support 106 is attached to a shaft 118. The shaft 118 is connected to a motion assembly 121. The motion assembly 121 includes one or more actuators and/or adjustment devices that provide movement and/or adjustment for the shaft 118 and/or the substrate support 106 within the processing volume 136.

The substrate support 106 may include lift pin holes 107 disposed therein. The lift pin holes 107 are sized to accommodate lift pins 132 for lowering and lifting of the substrate 102 to and from the substrate support 106 before and/or after a deposition process is performed. The lift pins 132 may rest on lift pin stops 134 when the substrate support 106 is lowered from a process position to a transfer position. The lift pin stops 134 can be coupled to a second shaft 104 through a plurality of arms.

The flow module 112 includes a plurality of gas inlets 114, a plurality of purge gas inlets 164, and one or more gas exhaust outlets 116. The gas inlet(s) 114 are fluidly connected to one or more process gas sources 151 and one or more cleaning gas sources 153. The purge gas inlet(s) 164 are fluidly connected to one or more purge gas sources 162. The one or more gas exhaust outlets 116 are fluidly connected to an exhaust pump 157. One or more process gases supplied using the one or more process gas sources 151 can include one or more reactive gases (such as one or more of silicon (Si), phosphorus (P), and/or germanium (Ge)) and/or one or more carrier gases (such as one or more of nitrogen ($N_2$) and/or hydrogen ($H_2$)). One or more purge gases supplied using the one or more purge gas sources 162 can include one or more inert gases (such as one or more of argon (Ar), helium (He), hydrogen ($H_2$), and/or nitrogen ($N_2$)). One or more cleaning gases supplied using the one or more cleaning gas sources 153 can include one or more of hydrogen (H) and/or chlorine (Cl). In one or more embodiments, the one or more process gases include silicon phosphide (SiP) and/or phospine ($PH_3$), and the one or more cleaning gases include hydrochloric acid (HCl).

The one or more gas exhaust outlets 116 are further connected to or include an exhaust system 178. The exhaust system 178 fluidly connects the one or more gas exhaust outlets 116 and the exhaust pump 157. The exhaust system 178 can assist in the controlled deposition of a layer on the substrate 102.

The controller 120 is configured to control the sensor devices, the deposition, the cleaning, the rotational position, the heating, the movable radiation reflector 352, and gas flow through the processing chamber 100 by providing an output to the controls for the heat sources 141, 143, the actuator 362, the gas flow, and the motion assembly 121. The controls include controls for the sensor devices, the upper heat sources 141, the lower heat sources 143, the process gas source 151, the actuator 362, the purge gas source 162, the motion assembly 121, and the exhaust pump 157.

The controller 120 is configured to adjust the output to the controls based on the sensor readings, a system model, and stored readings and calculations. The controller 120 includes embedded software and a compensation algorithm to calibrate measurements. The controller 120 can include one or more machine learning algorithms and/or artificial intelligence algorithms that estimate optimized parameters for the deposition operations and/or the cleaning operations (such as for adjusting a vertical position of the movable radiation reflector 352 and/or adjusting the angle TA1 of the movable radiation reflector 352). The optimized parameter can include, for example, a center-to-edge profile for the substrate 102 (which facilitates uniformity) with respect to temperature, gas flow rate, and/or deposition thickness.

The one or more machine learning algorithms and/or artificial intelligence algorithms may implement, adjust and/or refine one or more algorithms, inputs, outputs or variables described above. Additionally or alternatively, the one or more machine learning algorithms and/or artificial intelligence algorithms may rank or prioritize certain aspects of adjustments of the reflector assembly 300, the method 500, and/or the method 600 relative to other aspects of the reflector assembly 300, the method 500, and/or the method 600. The one or more machine learning algorithms and/or artificial intelligence algorithms may account for other changes within the processing systems such as hardware replacement and/or degradation. In one or more embodiments, the one or more machine learning algorithms and/or artificial intelligence algorithms account for upstream or downstream changes that may occur in the processing system due to variable changes of the process chamber 100 and/or the method 2000. For example, if variable "A" is adjusted to cause a change in aspect "B" of the process, and such an adjustment unintentionally causes a change in aspect "C" of the process, then the one or more machine learning algorithms and/or artificial intelligence algorithms may take such a change of aspect "C" into account. In such an embodiment, the one or more machine learning algorithms and/or artificial intelligence algorithms embody predictive aspects related to implementing the reflector assembly 300, the method 500, and/or the method 600. The predictive aspects can be utilized to preemptively mitigate unintended changes within a processing system.

The one or more machine learning algorithms and/or artificial intelligence algorithms can use, for example, a regression model (such as a linear regression model) or a clustering technique to estimate optimized parameters. The algorithm can be unsupervised or supervised. The one or more machine learning algorithms and/or artificial intelligence algorithms can optimize, for example, a heating power applied to the heat sources 141, 143, the vertical position of the movable radiation reflector 352, and/or the angle TA1 of the movable radiation reflector 352.

The one or more machine learning algorithms and/or artificial intelligence algorithms can optimize, for example, a center-to-edge temperature profile across the substrate 102 during deposition operations. The center-to-edge temperature profile can be pre-generated using simulation operations, and the one or more machine learning algorithms and/or artificial intelligence algorithms can use real-time collected data to adjust the center-to-edge temperature profile. The center-to-edge concentration profile is affected, for example, by the vertical position and/or the angle TA1 of the movable radiation reflector 352.

In one or more embodiments, the controller 120 automatically conducts one or more operations described herein without the use of one or more machine learning algorithms or artificial intelligence algorithms. In one or more embodiments, the controller 120 compares measurements (such as of gas flow rate(s) and/or deposition thickness) to data in a look-up table and/or a library to determine if adjustment(s) can be used to facilitate a center-to-edge profile. The controller 120 can stored measurements as data in the look-up table and/or the library.

Figure 2A:
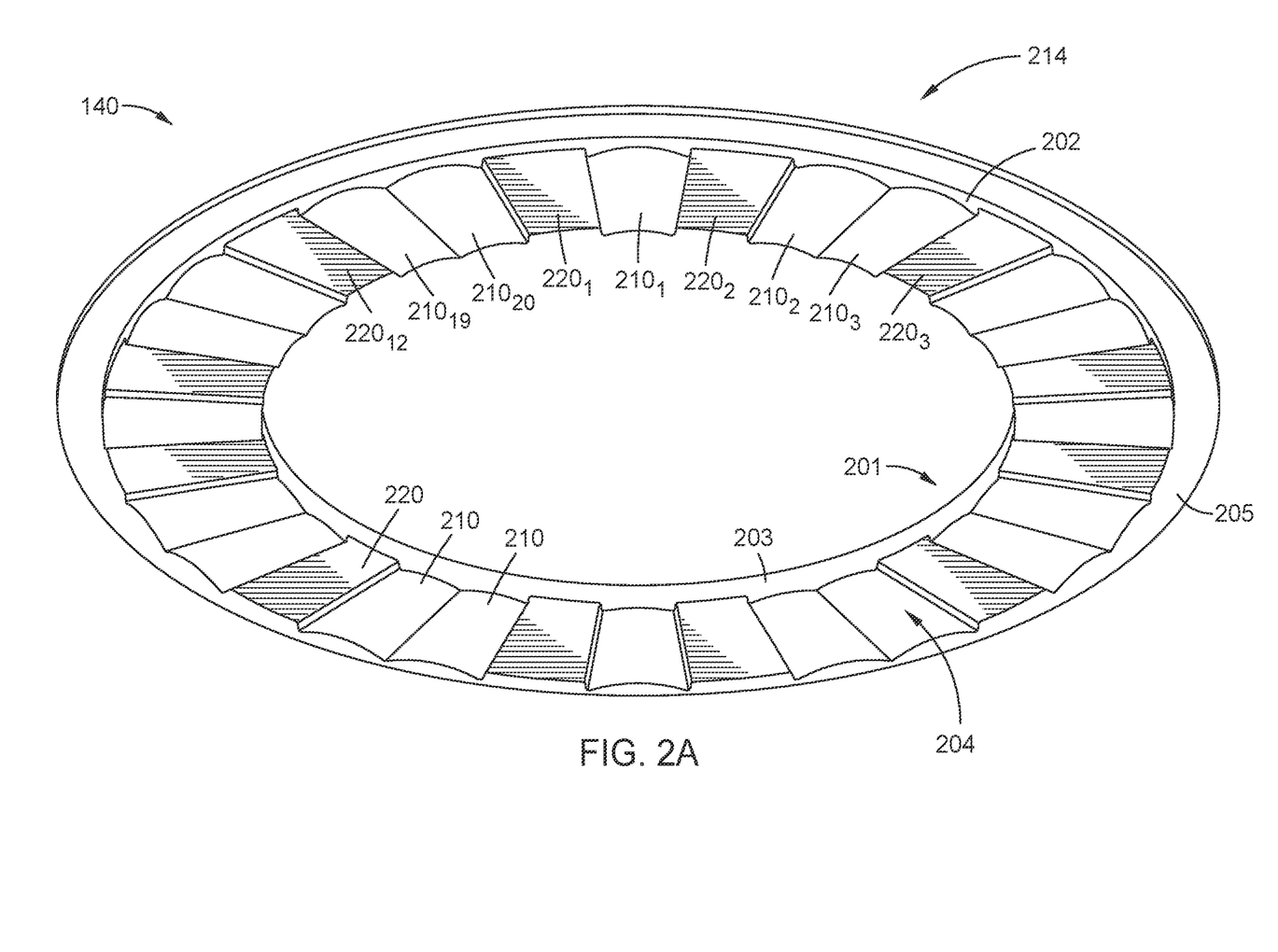
FIG. 2A illustrates a schematic bottom perspective view of an upper lamp reflector to be used in the processing chamber of FIG. 1, according to one or more embodiments.

FIG. 2A illustrates a schematic bottom view of the upper lamp reflector 140 of FIG. 1, according to one or more embodiments. As the upper heat source 141 radiates thermal energy in an omnidirectional manner, the upper lamp reflector 140 is configured to reflect the thermal energy that is radiated away from the substrate 102 back to the substrate 102. The upper lamp reflector 140 includes an annular body 201 that includes an outer edge 202, an inner edge 203, a top side 214, and a bottom side 204. The upper lamp reflector 140 includes an outer rim 205 disposed above and outward of the bottom side 204 of the annular body 201. The annular body 201 is a ring shaped body with a center opening as shown in FIG. 2A. The outer rim 205 can be used to align the reflector assembly 300 relative to the lid 154. The bottom side 204 includes a plurality of concave reflector structures, which include first reflecting surfaces 210. The bottom side 204 also includes a plurality of second reflecting surfaces 220, which may be flat or concave. The second reflecting surfaces 220 are shown with surface shading in FIG. 2A to visually differentiate the second reflecting surfaces 220 from the first reflecting surfaces 210. Each first reflecting surface 210 and each second reflecting surface 220 is positioned at a different angular location relative to a centerline of the annular body 201. As shown in FIG. 2A, the upper lamp reflector 140 includes about 20 first reflecting surfaces 210 ($210_1 \ldots 210_{20}$) and about 12 second reflecting surfaces 220 ($220_1 \ldots 210_{12}$).

Figure 2B:
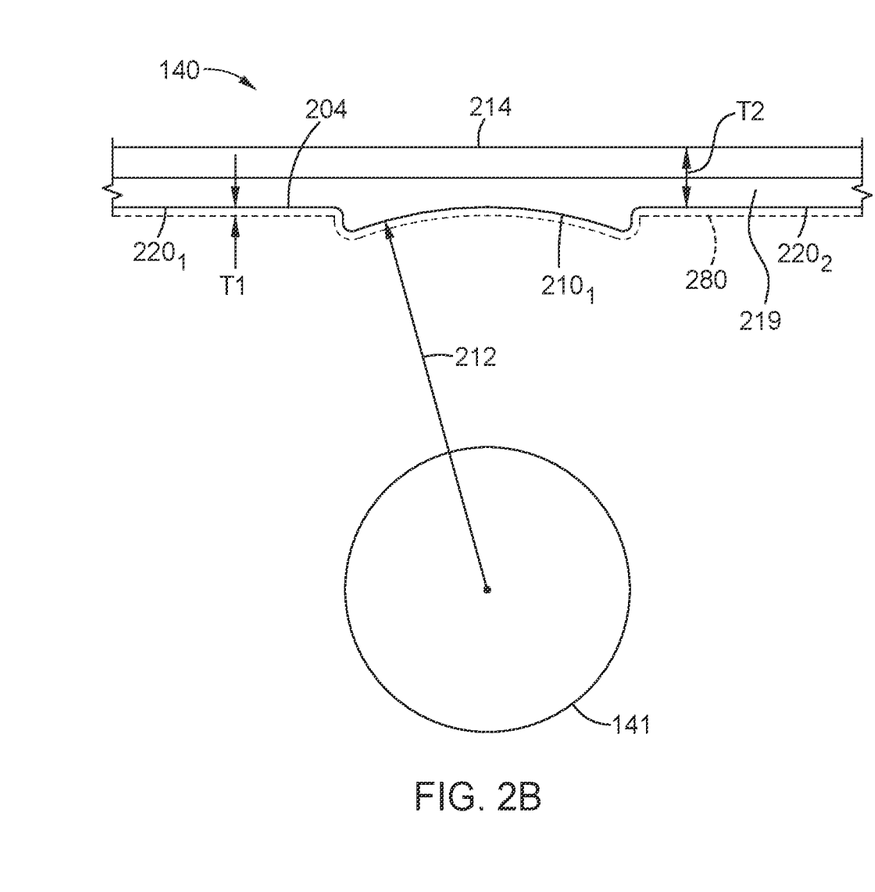
FIG. 2B illustrates a schematic partial side sectional view of the upper lamp reflector of FIG. 2A, according to one or more embodiments.

FIG. 2B illustrates a schematic partial side sectional view of the upper lamp reflector of FIG. 2A, according to one or more embodiments. The partial side sectional view of FIG. 2B illustrates relative positions between the upper lamp reflector 140 including the reflecting surfaces $220_1$, $210_1$, and $220_2$ and the heat source 141. As shown in FIG. 2B, the heat sources 141 are disposed between the first reflecting surfaces 210 and the upper window 108 of the process chamber 100 (e.g., between the first reflecting surfaces 210 and the substrate support 106). The first reflecting surfaces 210 and/or the second reflecting surfaces 220 are coated with a protective layer 280. Each first reflecting surface 210 has a curved surface whose radius of curvature 212 that may be determined according to the form factors of the heat source 141. Each second reflecting surface 220 may be substantially flat. In one or more embodiments, each first reflecting surface 210 has a partial cylindrical shape extending in a radial direction from the outer edge 202 towards the inner edge 203 of the upper lamp reflector 140.

Figure 3A:
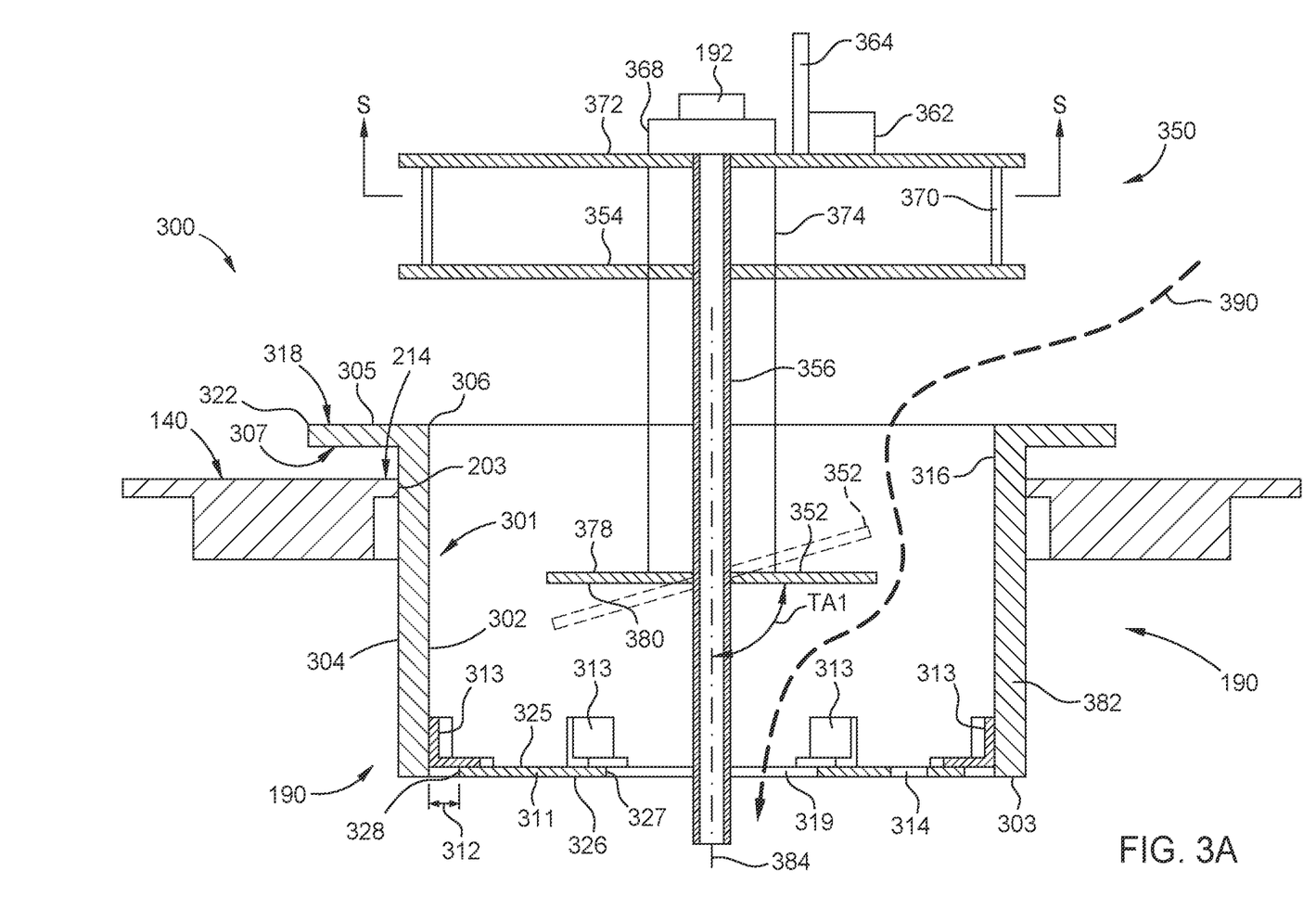
FIG. 3A illustrates a schematic cross sectional side view of a reflector assembly with a movable radiation reflector, according to one or more embodiments.

FIG. 3A is a schematic cross sectional side view of a reflector assembly 300, according to one or more embodiments. The reflector assembly 300 includes the upper shell assembly 190, the upper source reflector 140 (e.g., the upper lamp reflector), and a central radiation reflector structure 350. The upper shell assembly 190 couples the upper source reflector 140 with the central radiation reflector structure 350 and includes a shell body 301, and a shell flange 305. The shell body 301 includes a cylindrical wall 382, an inner surface 302, and an outer surface 304, a proximate end 316, and a distal end 303. The shell flange 305 includes an upper surface 318, a lower surface 307, an inner diameter edge 306, and an outer diameter edge 322 that extends radially outward from the inner surface 302 of the shell body 301. The shell flange 305 is connected to the proximate end 316 of the shell body 301 at the inner diameter edge 306 as a one piece monolithic structure. In one or more embodiments, the shell body 301 is a shell sleeve. The upper shell assembly 190 may have an optional lower annular reflector 311 located at the distal end 303 of the shell body 301. The lower radiation reflector 311 may be disk-shaped having a top and bottom surface, 325, 326, respectively, with an inner edge 327, and an outer edge 328. The lower radiation reflector 311 may be a separate component connected to the shell body 301, or may be connected to the distal end 303 of the shell body 301 as a one piece monolithic structure.

The lower radiation reflector 311 may be connected to the inner surface 302 of the shell body 301. In one or more embodiments, the inner surface 302 defines an inner diameter of the shell body 301 and the outer surface 304 defines an outer diameter of the shell body 301 (e.g., the shell sleeve). The top surface 325 of the lower radiation reflector 311 may be connected to the inner surface 302 by connectors 313 in a manner that creates an annular gap 312 between the inner surface 302 and the outer edge 328. The connector 313 may be a bracket or structure suitable for connecting the lower radiation reflector 311 to the shell body 301. The lower radiation reflector 311 is constructed of the same material as the upper source reflector 140 and/or is polished and/or coated similarly. The lower radiation reflector 311 may have a cut out 314 that enables a second temperature sensor (e.g., in addition to the upper temperature sensor 192), for example a pyrometer, to have a line of sight down to an outer region (such as an edge) of the substrate 102.

The central radiation reflector structure 350 includes a movable radiation reflector 352, an upper radiation reflector 354, the sensor tube 356 (e.g., an elongated tube), and a mounting plate 372. The central radiation reflector structure 350 is capable of directing radiant energy toward the substrate 102 by using the radiation reflectors 311, 352, and 354 disposed at various locations.

In one or more embodiments, the sensor tube 356, the movable radiation reflector 352, and the cylindrical wall 382 are coaxially arranged with respect to each other along a common center axis 384. The center axis 384 may also extend through a center of the substrate support 106. The movable radiation reflector 352 is capable of being axially displaced along the center axis 384. For example, the movable radiation reflector 352 may initially be stowed adjacent to the lower radiation reflector 311 and then move relative to the lower radiation reflector 311 and to a higher location along the sensor tube 356. The movement of the movable radiation reflector 352 changes the distance between the movable radiation reflector 352 and the substrate support 106, which in turn, changes the amount of radiant energy directed (e.g., reflected) toward the substrate support 106 by the movable radiation reflector 352. The displacement of the movable radiation reflector 352 also generates an air flow channel located between the movable radiation reflector 352 and the lower radiation reflector 311. As the location of the movable radiation reflector 352 adjusts along the vertical direction, the size of the flow channel (such as a height) between the movable radiation reflector 352 and the lower radiation reflector 311 also changes, which may allow more or less air to be circulated. Both the amount of heat directed toward the substrate 102 and/or the substrate support 106, and the amount of circulating air can be used to fine-tune and control the temperature profile of the substrate 102 (and/or the substrate support 106) and/or the temperature of the upper window 108. The temperatures of the substrate 102, the substrate support 106, and/or the upper window 108 can be adjusted by moving the movable radiation reflector 352.

In one or more embodiments, an angle TA1 between the movable radiation reflector 352 and the center axis 384 may be adjusted. A tilted position of the movable radiation reflector 352 is shown in dashed lines in FIG. 3A. The movable radiation reflector 352 can be maintained at an orientation that is perpendicular to the center axis 384 and the cylindrical wall 382 (e.g., such that the angle TA1 is about 90 degrees). The movable radiation reflector 352 may be tilted via an actuator and a coupling mechanism to adjust an orientation relative to the center axis 384 and the cylindrical wall 382.

The mounting plate 372 is configured to serve as a platform to support other parts of the central radiation reflector structure 350. For example, an actuator 362 and the sensor tube 356 are attached to the mounting plate 372. The actuator 362 is used to drive the movable radiation reflector 352 via the coupling system. The actuator 362 may be an electric motor, a pneumatic actuator, a linear actuator, or any other suitable actuator. In one or more embodiments, the actuator 362 includes a threaded shaft that is rotated to drive a threaded block and axially move the threaded block. The threaded block can be coupled (e.g., directly or indirectly) to the movable reflector plate 352 such that axial movement of the threaded block drives axial movement of the movable reflector plate 352. In one or more embodiments, the coupling system allows the movable radiation reflector 352 to be axially displaced along the center axis 384. The coupling system controls the orientation of the movable radiation reflector 352, such as maintaining the orientation of the movable radiation reflector 352 to be perpendicular to the cylindrical wall 382 or tilting the movable radiation reflector 352. The coupling system may include one or more of beams, fins, a chain of planetary or worm gears, chains and sprockets, and/or any other suitable motion transmission systems. As shown in FIG. 3A, the coupling system includes a first coupling mechanism 364 and a second coupling mechanism 374, while the second coupling mechanism 374 connects with the movable radiation reflector 352 and the first coupling mechanism 364 couples the second coupling mechanism 374 with the actuator 362. The first coupling mechanism 364 and the second coupling mechanism 374 may be combined into a single coupling mechanism. In one or more embodiments, the actuator 362 is an electric motor, the first coupling mechanism 364 is a worm gear that converts a rotary motion to a linear motion, and the second coupling mechanism 374 includes flanges (such as fins) that couple to the first coupling mechanism 364 through the mounting plate 372. In one or more embodiments, a sensor stage 368 mounts the upper temperature sensor 192 to the mounting plate 372.

The upper radiation reflector 354 may be attached to the mounting plate 372 via a plurality of couplers 370, such as fasteners, for example bolts or screws. The couplers 370 may also attach the mounting plate 372 to the lid 154 and/or the upper source reflector 140. A gap is formed between the mounting plate 372 and the upper radiation reflector 354 to form a cooling channel so that the temperature of the mounting plate 372 can be adjusted (e.g., lowered) during processing of a substrate. The upper radiation reflector 354 may directly contact the mounting plate 372 without using couplers 370, and/or the upper radiation reflector 354 may be attached to the sensor tube 356. In one or more embodiments, the upper radiation reflector 354 is an optical component of the central radiation reflector structure 350. In one or more embodiments, the mounting plate 372, the second coupling mechanism 374, and the movable radiation reflector 352 move relative to the sensor tube 356 using actuation of the actuator 362. In one or more embodiments, the mounting plate 372, the second coupling mechanism 374, the movable radiation reflector 352, the upper radiation reflector 354, and the sensor tube 356 move together using actuation of the actuator 362. For example, the movable radiation reflector 352 can be movable relative to the sensor tube 356, or the movable radiation reflector 352 can be fixed in place relative to the sensor tube 356 such that the movable radiation reflector 352 and the sensor tube 356 move together.

A temperature sensor 192, such as a pyrometer, is mounted to an end of the sensor tube 356. The temperature sensor 192 is capable of detecting the temperature of the substrate 102 remotely in non-contact manner. To provide both line of sight to the temperature sensor 192 and shield the same from interference by other components, the sensor tube 356 represents an elongated tubular member that extends beyond the distal end of the shell body 301 and points to a central area of the substrate 102. The sensor tube 356 may have a circular shape, a rectangular shape, or another suitable shapes. In one or more embodiments, the movable radiation reflector 352 and the second coupling mechanism 374 are attached to the sensor tube 356 such that the sensor tube 356 moves together with the movable radiation reflector 352 and the second coupling mechanism 374. In one or more embodiments, the sensor tube 356 is attached to the mounting plate 372 while the movable radiation reflector 352 and the second coupling mechanism 374 are not attached to the sensor tube 356. In such a way, the movable radiation reflector 352 can move freely and independently from the sensor tube 356.

The movable radiation reflector 352 has a disk shape and includes a top surface 378 and a bottom surface 380. In one or more embodiments, the top surface 378 is absorptive while the bottom surface 380 is reflective. The bottom surface 380 is shaped so that radiant energy (such as radiant heat) impinging on the bottom surface 380 is directed toward the substrate 102. For example, the bottom surface 380 may have a concave shape to focus radiant energy to a central area of the substrate 102. The bottom surface 380 may have a flat shape that directs radiant energy toward the substrate 102 without any focusing effect. The bottom surface 380 may be constructed of the same material as the upper lamp reflector 140, or other suitable material, such as the reflective material(s) discussed herein, and/or may be polished and/or coated similarly.

The movable radiation reflector 352 is disposed around the common center axis 384 of the sensor tube 356 and the upper radiation reflector 354. The sensor tube 356 extends beyond a distal end of the shell body 301. The movable radiation reflector 352 includes a center hole at a central area of the movable radiation reflector 352 to allow the sensor tube 356 to pass through the movable radiation reflector 352. As shown in FIG. 3A, the movable radiation reflector 352 has an outer diameter smaller than the inner diameter of the inner surface 302 of the shell body 301, and the movable radiation reflector 352 is spaced apart from the inner surface 302, thus leaving a space between the movable radiation reflector 352 and the inner surface 302 that can be utilized as a channel to permit the flow of a fluid medium 390, such as air or liquid.

In one or more embodiments, the movable radiation reflector 352 is disposed within the shell body 301, and one or more cylindrical walls 382 of the shell body 301 separate the movable radiation reflector 352 from the upper source reflector 140 and the upper heat sources 141. Such a configuration allows the movable radiation reflector 352 and the upper source reflector 140 to reflect radiation that is reflected off of different parts of the processing chamber 100. For example, the upper source reflector 140 is configured to redirect radiant heat generated by the heat source 141. At the meantime, certain amount of radiant energy may be reflected by the substrate 102, the upper window 108, and other surfaces of the processing chamber. The radiant energy propagating out of the process volume 136 through the upper window 108 of the processing chamber may impinge on the bottom surface 380. Once those reflected radiant energy reaches the bottom surface 380, it will be reflected and directed back toward the substrate 102.

In one or more embodiments, the actuator 362 has a range of motion to displace the movable radiation reflector 352 out from within the shell body. For example, the actuator 362 may move the movable radiation reflector 352 above the upper surface 318 of the shell body 301. In one or more embodiments, an inner diameter of a shell hole 319 of the shell body is larger than the outer diameter of the reflector disk of the movable radiation reflector 352 such that the actuator 362 may move the movable radiation reflector 352 below the bottom surface 326 of the shell body 301.

Figure 3B:
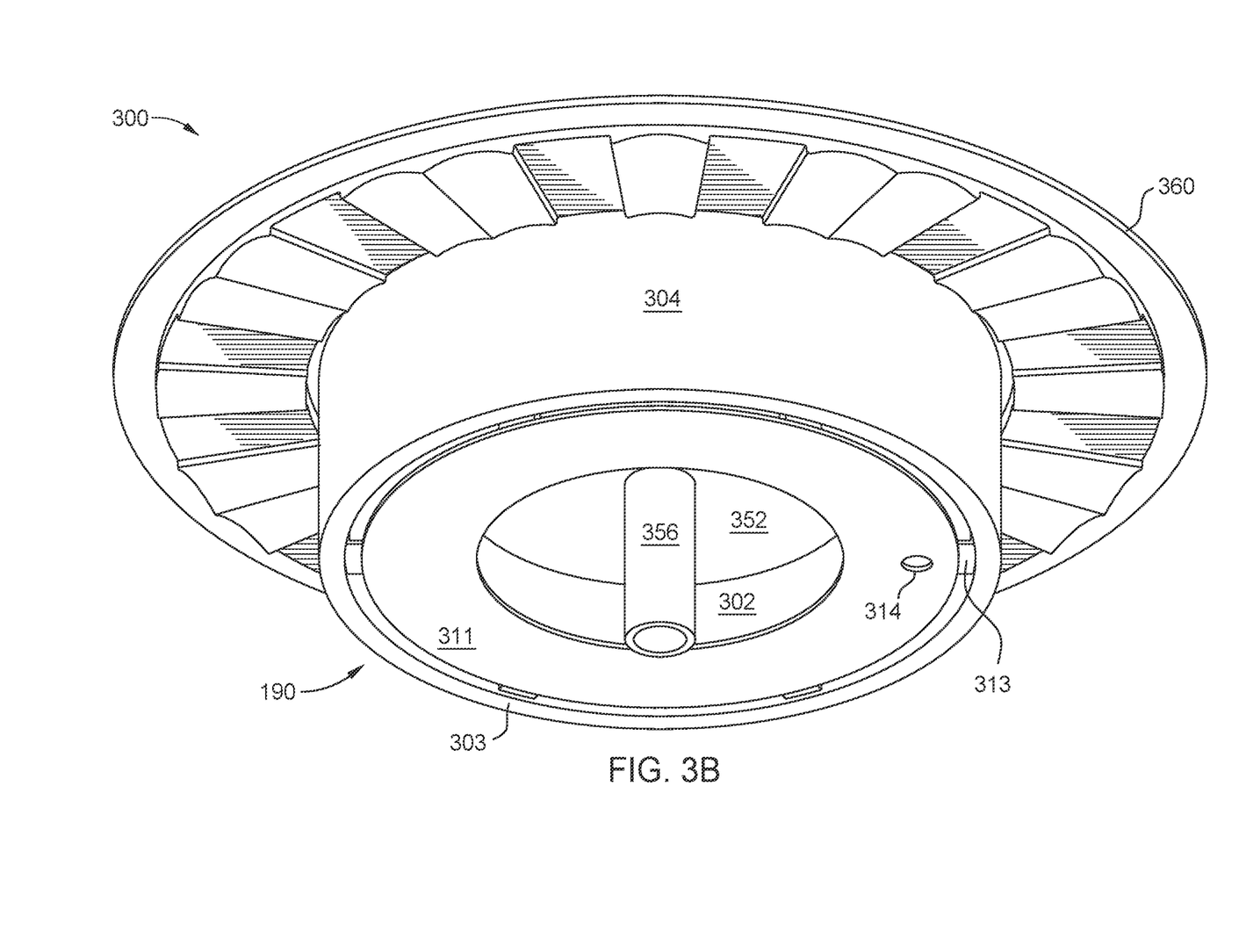
FIG. 3B illustrates a schematic bottom perspective view of the reflector assembly with a movable radiation reflector, according to one or more embodiments.

FIG. 3B illustrates a schematic bottom perspective view of the reflector assembly 300 including the upper shell assembly 190, the upper lamp reflector 140, and the central radiation reflector structure 350, according to one or more embodiments. The body 360 is configured to be interfaced with at least the shell body 301 to facilitate reducing interfering reflections from measuring equipment, such as the upper temperature sensor 192. The cylindrical wall 382 facilitates shielding the movable radiation reflector 352 from being directly radiated by the heat source 141.

Figure 4:
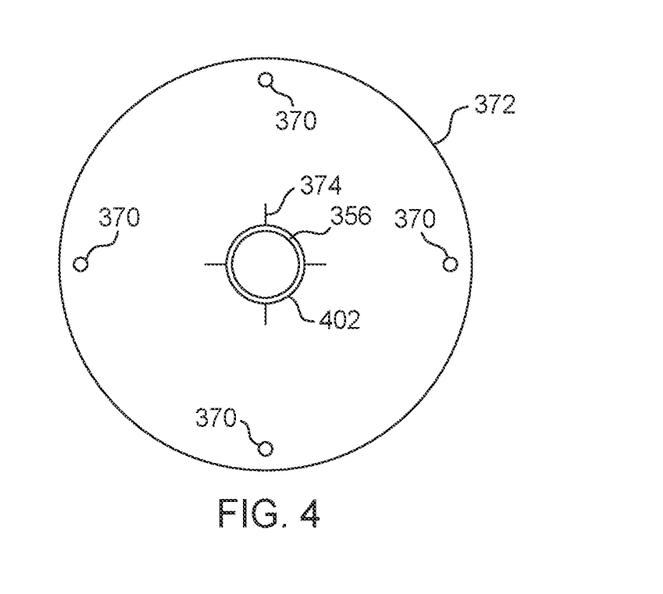
FIG. 4 illustrates a schematic cross sectional view of the movable reflector, according to according to one or more embodiments.

FIG. 4 illustrates a schematic cross-sectional view of the central radiation reflector structure 350, according to one or more embodiments. The cross-sectional view represents the view along the "S-S" cross-section line shown in FIG. 3A. As shown in FIG. 4, the mounting plate 372 has a center hole 402 that allows the sensor tube 356 to pass through. The second coupling mechanism 374 is disposed around the center hole 402 and may or may not be coupled with the sensor tube 356. The center hole 402 may also be included in the upper radiation reflector 354 and the movable radiation reflector 352. A plurality of couplers 370 are disposed around the perimeters of the mounting plate 372. In one or more embodiments, the second coupling mechanism 374 includes a plurality of fins extending radially outward relative to the sensor tube 356, and the couplers 370 include beams.

Figure 5:
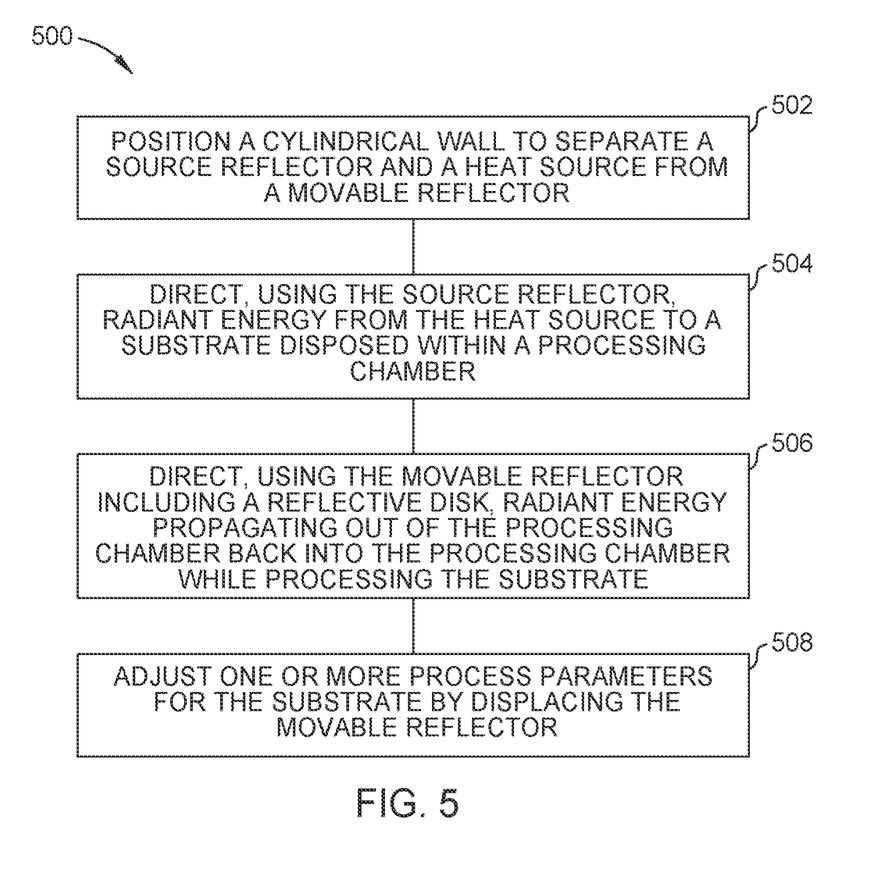
FIG. 5 illustrates a method for processing a substrate, according to one or more embodiments.

FIG. 5 illustrates a method 500 for processing a substrate, according to one or more embodiments. The method 500 can include loading a substrate 102 into a processing chamber 100 that includes the reflector assembly 300.

At operation 502, a cylindrical wall of the shell body 301 is positioned to separate the source reflector 140 and the heat source 141, such as a lamp, from the movable radiation reflector 352. When the substrate 102 is processed, the heat source 141 generates radiant energy to heat the substrate 102. The present disclosure contemplates that operation 502 can be optional and can be omitted from the method 500.

At operation 504, the upper source reflector 140 directs radiant energy from the heat source 141 to the substrate 102 disposed within the processing chamber 100. The radiant energy enters the processing chamber 100 and is absorbed by the substrate support 106 and/or the substrate 102. Certain radiant energy is reflected off of parts of the processing chamber 100 (such as by the substrate support 106, the substrate 102, and/or other surfaces in the processing chamber) and propagate out through the upper window 108 of the processing chamber.

At operation 506, when the radiant energy propagating out of the processing chamber impinges on the reflective bottom surface 380 of the movable radiation reflector 352, the movable radiation reflector 352 directs (e.g., reflects) such radiant energy back through the upper window 108 and into the processing chamber 100 while the substrate 102 is being processed (e.g., while a film is epitaxially deposited on the substrate 102).

At operation 508, one or more process parameters (such as temperature uniformity and/or deposition uniformity) for the substrate are adjusted by moving the movable radiation reflector 352. In one or more embodiments, the moving includes axially moving and/or angularly tilting the movable radiation reflector 352.

The present disclosure contemplates that operation 508 can be conducted simultaneously with operation 504 and/or operation 506.

The axially moving can include displacing the reflective disk along an axis of an elongated tube 356, and the angularly tilting can include tilting an inclination of the reflective disk relative to an axis of the sensor tube 356 (e.g., an elongated tube).

Method 500 can include (e.g., simultaneously with one of more of operation 504, operation 506, and/or operation 508) flowing a heat transfer fluid (such as cooling fluid, for example air or liquid) into a volume above the upper window 108. The heat transfer fluid can flow, for example, along the path of the fluid medium 390. The heat transfer fluid can cool or heat the upper window 108, which can cool or heat the substrate support 106 and/or the process volume 136.

Figure 6:
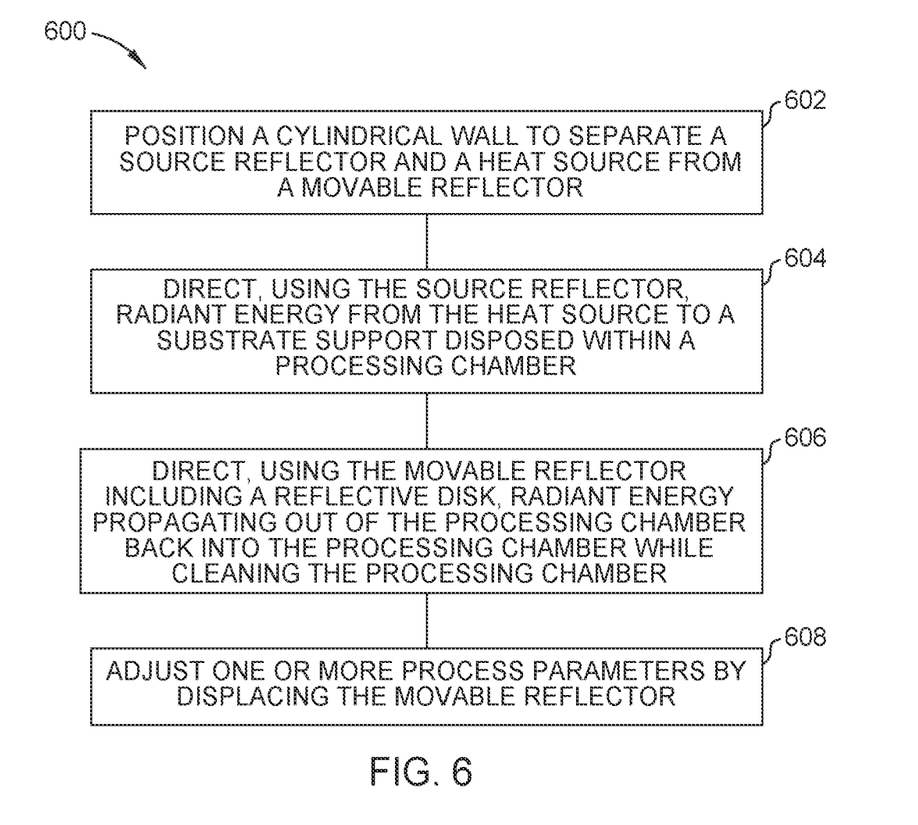
FIG. 6 illustrates a method for cleaning the processing chamber, according to one or more embodiments.

FIG. 6 illustrates a method 600 for cleaning the processing chamber 100, according to one or more embodiments. The method 600 can include transferring a substrate (such as the substrate 102 of the method 500) out of the processing chamber 100 that includes the reflector assembly 300.

At operation 602, a cylindrical wall of the shell body 301 is positioned to separate the source reflector 140 and the heat source 141, such as a lamp, from the movable radiation reflector 352. When processing chamber 100 is cleaned, the heat source 141 generates radiant energy to heat the substrate support 106 while flowing cleaning gases (such as hydrochloric acid). The present disclosure contemplates that operation 602 can be optional and can be omitted from the method 600.

At operation 604, the upper source reflector 140 directs radiant energy from the heat source 141 to the substrate support 106 disposed within the processing chamber 100. The radiant energy enters the processing chamber 100 and is absorbed by the substrate support 106. Certain radiant energy is reflected off of parts of the processing chamber 100 (such as by the substrate support 106 and/or other surfaces in the processing chamber) and propagate out through the upper window 108 of the processing chamber.

At operation 606, when the radiant energy propagating out of the processing chamber impinges on the reflective bottom surface 380 of the movable radiation reflector 352, the movable radiation reflector 352 directs (e.g., reflects) such radiant energy back through the upper window 108 and into the processing chamber 100 while the processing chamber is being cleaned (e.g., while one or more cleaning gases flow through the process volume 136).

At operation 608, one or more process parameters (such as temperature uniformity) for the substrate support 106 and/or the upper window 108 are adjusted by moving the movable radiation reflector 352. In one or more embodiments, the moving includes axially moving and/or angularly tilting the movable radiation reflector 352.

The present disclosure contemplates that operation 608 can be conducted simultaneously with operation 604 and/or operation 606. The present disclosure contemplates that method 600 can be conducted before or after the method 500.

The axially moving can include displacing the reflective disk along an axis of an elongated tube 356, and the angularly tilting can include tilting an inclination of the reflective disk relative to an axis of an elongated tube 356.

Method 600 can include (e.g., simultaneously with one of more of operation 604, operation 606, and/or operation 608) flowing a heat transfer fluid (such as cooling fluid, for example air or liquid) into a volume above the upper window 108. The heat transfer fluid can flow, for example, along the path of the fluid medium 390. The heat transfer fluid can cool or heat the upper window 108, which can cool or heat the substrate support 106 and/or the process volume 136.

Using subject matter herein, a variety of temperature profiles from a center to an edge of a substrate surface can be used by using a variety of vertical positions of the movable radiation reflector 352. For example, each vertical position of the movable radiation reflector 352 can facilitate a different temperature profile along the center to the edge of the substrate surface.

As an example, a center-to-edge temperature profile of a substrate during processing can be adjusted by adjusting the vertical position of the movable radiation reflector 352. Similarly, the center-to-edge temperature profile of the upper window 108 during deposition and/or cleaning can be adjusted by adjusting the vertical position of the movable radiation reflector 352.

Benefits of the present disclosure include accurately, simply, and effectively adjusting one or more process parameters (such as temperature profiles of the substrate 102, the substrate support 106, and/or the upper window 108) of deposition operations and/or cleaning operations; enhancing deposition uniformity (such as center-to-edge uniformity); making cleaning operations more efficient; optimizing (e.g., balancing) deposition on the substrate 102 and coating on the upper window 108; and adjusting process parameters in a manner that is modular across a variety of chamber configurations.

It is contemplated that aspects described herein can be combined. For example, one or more features, aspects, components, operations, and/or properties of the process chamber 100, the controller 120, the upper source reflector 140, the reflector assembly 300, the method 500, and/or the method 600 can be combined. It is further contemplated that any combination(s) can achieve the benefits described herein.

While the foregoing is directed to embodiments of the present disclosure, other and further embodiments of the disclosure may be devised without departing from the basic scope thereof, and the scope thereof is determined by the claims that follow.

What is claimed is:

1. A radiation reflector assembly for use with a semiconductor processing chamber, the radiation reflector assembly comprising:
a shell body comprising an interior cylindrical wall;
a reflector disk comprising a center hole, a bottom reflective surface and a top surface, the reflector disk disposed within and spaced from the interior cylindrical wall in a manner that permits fluid to flow therebetween;
an actuator coupled to the reflector disk, the actuator operable to axially displace the reflector disk relative to the shell body; and
an elongated tube extending through the center hole of the reflector disk.

2. The radiation reflector assembly according to claim 1, further comprising:
a temperature sensor attached to the radiation reflector assembly, the temperature sensor operable to sense a temperature of an object by collecting energy through the elongated tube.

3. The radiation reflector assembly according to claim 2, wherein the temperature sensor comprises a pyrometer.

4. The radiation reflector assembly according to claim 1, wherein the reflector disk is attached to the elongated tube.

5. The radiation reflector assembly according to claim 1 further comprising:
a coupling mechanism connecting the actuator with the reflector disk in a manner that maintains the reflector disk in a perpendicular orientation relative to a center axis of the interior cylindrical wall.

6. The radiation reflector assembly according to claim 5, wherein the coupling mechanism converts a rotary motion of the actuator to a linear motion.

7. The radiation reflector assembly according to claim 1, wherein the shell body, the reflector disk, and the elongated tube are coaxially arranged with respect to each other.

8. The radiation reflector assembly according to claim 1, wherein an orientation of the reflector disk is adjustable relative to a center axis of the interior cylindrical wall.

9. The radiation reflector assembly according to claim 1, wherein the reflector disk is movable relative to the elongated tube.

10. The radiation reflector assembly according to claim 1, wherein an inner diameter of a shell hole of the shell body is larger than an outer diameter of the reflector disk, and the actuator has a range of motion configured to displace the reflector disk out from within the shell body.

11. A substrate processing system for processing a substrate comprising:
a chamber body comprising an internal volume;

a substrate support disposed in the internal volume;

a transparent window supported at least partially by the chamber body;

a shell body disposed above the transparent window and comprising an interior cylindrical wall;

a plurality of heat sources disposed above the transparent window and circumscribing the shell body;

a reflector disk separated from the plurality of heating lamps by the shell body; and an actuator coupled to the reflector disk, the actuator operable to axially displace the reflector disk within the interior cylindrical wall of the shell body.

12. The substrate processing system of claim 11, further comprising:

an elongated tube extending through a center hole of the reflector disk.

13. The substrate processing system of claim 12, wherein the substrate support is configured to support a substrate thereon, and the substrate processing system further comprises:

a temperature sensor positioned to sense temperature of the substrate disposed on the substrate support by collecting energy through the elongated tube.

14. The substrate processing system according to claim 13, wherein the temperature sensor comprises a pyrometer.

15. The substrate processing system according to claim 12, wherein the reflector disk is attached to the elongated tube.

16. The substrate processing system according to claim 11, further comprising:

a coupling mechanism connecting the actuator to the reflector disk in a manner that maintains the reflector disk in a perpendicular orientation relative to a center axis of the interior cylindrical wall.

17. The substrate processing system according to claim 12, wherein the reflector disk is movable relative to the elongated tube.

18. The substrate processing system according to claim 11, wherein an angular orientation of the reflector disk is adjustable relative to a center axis of the interior cylindrical wall.

19. A method of processing a substrate, comprising:

directing, using a source reflector, radiant energy from a heat source to a substrate disposed within a processing chamber;

directing, using a movable radiation reflector comprising a reflective disk, radiant energy propagating out of the processing chamber back into the processing chamber while processing the substrate; and adjusting one or more process parameters for the substrate by moving the movable radiation reflector.

20. The method of claim 19, further comprising:

axially displacing the reflective disk along an axis of an elongated tube; and tilting an inclination of the reflective disk relative to an axis of an elongated tube.

* * * * *